(12) United States Patent
Jeong et al.

(10) Patent No.: US 12,130,728 B2
(45) Date of Patent: Oct. 29, 2024

(54) ELECTRONIC DEVICE AND METHOD CONTROLLING THE SAME

(71) Applicant: SAMSUNG ELECTRONICS CO., LTD., Suwon-si (KR)

(72) Inventors: Bongjae Jeong, Suwon-si (KR); Minseok Kang, Suwon-si (KR); Seungjun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 72 days.

(21) Appl. No.: 18/112,244

(22) Filed: Feb. 21, 2023

(65) Prior Publication Data
US 2023/0267071 A1 Aug. 24, 2023

Related U.S. Application Data

(63) Continuation of application No. PCT/KR2023/002127, filed on Feb. 14, 2023.

(30) Foreign Application Priority Data

Feb. 21, 2022 (KR) .................. 10-2022-0022540
Mar. 8, 2022 (KR) .................. 10-2022-0029636

(51) Int. Cl.
*G06F 11/00* (2006.01)
*G06F 11/07* (2006.01)
*G06F 11/36* (2006.01)

(52) U.S. Cl.
CPC .......... *G06F 11/366* (2013.01); *G06F 11/073* (2013.01); *G06F 11/0754* (2013.01); *G06F 11/0793* (2013.01)

(58) Field of Classification Search
CPC ............... G06F 11/073; G06F 11/0754; G06F 11/0793; G06F 11/366
See application file for complete search history.

(56) References Cited

U.S. PATENT DOCUMENTS 5,274,278 A * 12/1993 Bauer .................. G11C 8/12
                                                  365/230.06
7,502,921 B2    3/2009 Tomlin et al.
(Continued)

FOREIGN PATENT DOCUMENTS

JP      2010-157113 A    7/2010
JP        5915764 B2     5/2016
(Continued)

OTHER PUBLICATIONS

International Search Report (PCT/ISA/210) issued by the International Searching Authority on Jun. 2, 2023 in International Application No. PCT/KR2023/002127.
(Continued)

*Primary Examiner* — Joshua P Lottich
(74) *Attorney, Agent, or Firm* — Sughrue Mion, PLLC

(57) ABSTRACT

An electronic device includes: a memory storing instructions; and a processor connected to the memory and configured to execute the instructions to: based on a software error occurring in the electronic device, determine whether attribute data set in relation to a memory margin of the electronic device corresponds to a specified value, based on determining that the attribute data corresponds to the specified value, identify a software error occurrence history stored in the memory, identify a defect associated with a memory margin configuration set for the memory based on the occurring software error and the software error occurrence history, and change the memory margin configuration by performing memory training on the memory based on the identification of the defect, wherein the memory margin includes information about a driving voltage and information about latency associated with data transmission.

20 Claims, 9 Drawing Sheets

(56) References Cited

U.S. PATENT DOCUMENTS

| | | | |
|---|---|---|---|
| 7,877,593 | B2 | 1/2011 | Tomlin et al. |
| 9,025,399 | B1 | 5/2015 | Morris et al. |
| 9,627,029 | B2 | 4/2017 | Morris et al. |
| 10,649,844 | B2 | 5/2020 | Ide et al. |
| 10,915,388 | B2 | 2/2021 | Pao et al. |
| 11,216,337 | B2 | 1/2022 | Ide et al. |
| 11,953,988 | B2 | 4/2024 | Schaefer et al. |
| 2010/0169702 | A1 | 7/2010 | Takeda |
| 2010/0169729 | A1 | 7/2010 | Datta et al. |
| 2012/0221917 | A1* | 8/2012 | Bueb ................ H03M 13/6325 714/755 |
| 2013/0173970 | A1* | 7/2013 | Kleveland ............. G11C 29/50 714/710 |
| 2014/0173268 | A1* | 6/2014 | Hashimoto ............ G11C 29/52 713/2 |
| 2015/0228358 | A1 | 8/2015 | Agata et al. |
| 2015/0309858 | A1* | 10/2015 | Weilemann, II .... G06F 11/1068 714/47.3 |
| 2016/0378618 | A1 | 12/2016 | Cmielowski et al. |
| 2018/0046527 | A1* | 2/2018 | Reusswig ............. G06F 11/004 |
| 2018/0173432 | A1* | 6/2018 | Han ...................... G06F 3/0673 |
| 2019/0146864 | A1* | 5/2019 | Nair ...................... G11C 29/70 714/47.2 |
| 2019/0155671 | A1 | 5/2019 | Pao et al. |
| 2020/0371873 | A1 | 11/2020 | Schaefer et al. |
| 2020/0411086 | A1* | 12/2020 | Yim ........................ G11C 16/10 |
| 2021/0027830 | A1* | 1/2021 | Kim ....................... G06F 11/106 |
| 2021/0295943 | A1* | 9/2021 | Yamaki .................. G11C 16/26 |
| 2023/0056398 | A1* | 2/2023 | Cariello ................ G06F 3/0673 |
| 2023/0195381 | A1* | 6/2023 | Liu ........................ G06F 3/0611 711/103 |

FOREIGN PATENT DOCUMENTS

| | | |
|---|---|---|
| JP | 2019-96281 A | 6/2019 |
| JP | 2021-33452 A | 3/2021 |
| KR | 10-2010-0080383 A | 7/2010 |
| KR | 10-1915060 B1 | 11/2018 |
| KR | 10-2021-0157438 A | 12/2021 |

OTHER PUBLICATIONS

Written Opinion (PCT/ISA/237) issued by the International Searching Authority on Jun. 2, 2023 in International Application No. PCT/KR2023/002127.

* cited by examiner

101

ELECTRONIC DEVICE AND METHOD CONTROLLING THE SAME

CROSS-REFERENCE TO RELATED APPLICATIONS

This application is a by-pass continuation application of International Application No. PCT/KR2023/002127, filed on Feb. 14, 2023, which claims priority to Korean Patent Application No. 10-2022-0029636, filed on Mar. 8, 2022, and Korean Patent Application No. 10-2022-0022540, filed on Feb. 21, 2022, filed in the Korean Intellectual Property Office, the disclosures of each of which are incorporated by reference herein in their entirety.

BACKGROUND

1. Field

Various embodiments disclosed in this specification relate to an electronic device and a method of controlling the same.

2. Description of the Related Art

In an electronic device, a memory may store data. When a processor requests transmission of data stored in the memory, the memory may transmit data according to the request of the processor. The memory may exchange data with the processor within a range of a set reference voltage and a range of set latency. When a reference voltage of the memory is out of the range of the set reference voltage and/or the latency of the memory is out of the range of the set latency, data communication between the memory and the processor may fail. To perform data communication between the memory and the processor, the processor may adjust the range of the reference voltage and the range of the latency by performing memory training based on the environment of the electronic device. However, memory training performed in one environment may not be sufficient when the memory and corresponding processor are used in another environment.

SUMMARY

Before a user employs an electronic device, memory training for a memory included in the electronic device is performed in a memory production environment. The memory production environment may be different from an actual use environment of the electronic device. Accordingly, ranges of a reference voltage and latency set in the memory production environment may be different from ranges of a reference voltage and latency used for data communication in the actual use environment. As a result, data communication between the memory and the processor may fail at a specific reference voltage and specific latency.

When a software defect occurs in the electronic device in the actual use environment, the disclosure is intended to determine whether the software defect occurs in relation to a reference voltage and/or latency of a memory, and to improve the software defect by performing memory training based on the actual use environment.

According to an aspect of the disclosure, an electronic device includes: a memory storing instructions; and a processor connected to the memory and configured to execute the instructions to: based on a software error occurring in the electronic device, determine whether attribute data set in relation to a memory margin of the electronic device corresponds to a specified value, based on determining that the attribute data corresponds to the specified value, identify a software error occurrence history stored in the memory, identify a defect associated with a memory margin configuration set for the memory based on the occurring software error and the software error occurrence history, and change the memory margin configuration by performing memory training on the memory based on the identification of the defect, wherein the memory margin includes information about a driving voltage and information about latency associated with data transmission.

The processor may be further configured to execute the instructions to: identify a number of times that the software error occurs, based on the occurring software error and the software error occurrence history; and based on identifying that the number of times that the software error occurs is greater than or equal to a threshold count, determine that the defect associated with the memory margin configuration occurs in the memory.

The occurring software error may correspond to a first software error, and the software error occurrence history may include a history in which a second software error occurs.

The processor may be further configured to execute the instructions to determine that a defect associated with the memory margin occurs in the memory based on (i) a first detected state, which occurs in the memory due to the first software error and which is associated with the memory margin configuration, being the same as a second detected state, which occurs in the memory due to the second software error and which is associated with the memory margin configuration, and (ii) a first log stored in the memory depending on occurrence of the first software error being different from a second log stored in the memory depending on occurrence of the second software error.

The processor may be further configured to execute the instructions to determine that a defect associated with the memory margin occurs in the memory based on a first detected state, which occurs in the memory due to the first software error and which is associated with the memory margin configuration, being different from a second detected state, which occurs in the memory due to the second software error and which is associated with the memory margin configuration.

The processor may be further configured to execute the instructions to correct the defect, which is associated with the memory margin configuration and which occurs in the memory, by changing the memory margin configuration.

The memory margin configuration may include at least one configuration of a configuration of the driving voltage and a configuration of the latency.

The processor may be further configured to execute the instructions to: determine whether the data transmission performed based on the driving voltage and the latency, which are measured at a production stage of the memory, satisfies a specified condition; and store the attribute data to correspond to the specified value based on a result of determining whether the data transmission satisfies the specified condition.

The processor may be further configured to execute the instructions to, based on at least one of the data transmission performed at an arbitrary driving voltage included in a specified first range and arbitrary latency included in a specified second range failing, determine that the data transmission satisfies the specified condition.

The processor may be further configured to execute the instructions to, based on the software error occurring, store the software error occurrence history in the memory.

According to an aspect of the disclosure, a method for controlling an electronic device, the method includes: based on a software error occurring in the electronic device, determining whether attribute data set in relation to a memory margin of the electronic device corresponds to a specified value; based on determining that the attribute data corresponds to the specified value, identifying a software error occurrence history stored in a memory; identifying a defect associated with a memory margin configuration set for the memory based on the occurring software error and the software error occurrence history; and changing the memory margin configuration by performing memory training on the memory based on the identifying of the defect, wherein the memory margin may include information about a driving voltage and information about latency associated with data transmission.

The identifying of the defect may include: identifying a number of times that a software error occurs, based on the occurring software error and the software error occurrence history; and based on identifying that the number of times that the software error occurs is greater than or equal to a threshold count, determining that the defect associated with the memory margin configuration occurs in the memory.

The occurring software error may correspond to a first software error, and the software error occurrence history may include a history in which a second software error occurs.

The identifying of the defect may include determining that a defect associated with the memory margin occurs in the memory based on (i) a first detected state, which occurs in the memory due to the first software error and which is associated with the memory margin configuration, being the same as a second detected state, which occurs in the memory due to the second software error and which is associated with the memory margin configuration, and (ii) a first log stored in the memory depending on occurrence of the first software error being different from a second log stored in the memory depending on occurrence of the second software error.

The identifying of the defect may include determining that a defect associated with the memory margin occurs in the memory based on a first detected state, which occurs in the memory due to the first software error and which is associated with the memory margin configuration, being different from a second detected state, which occurs in the memory due to the second software error and which is associated with the memory margin configuration.

The changing of the memory margin configuration may include correcting the defect, which is associated with the memory margin configuration and which occurs in the memory.

The memory margin configuration may include at least one configuration of a configuration of the driving voltage and a configuration of the latency.

The method may further include: determining whether the data transmission performed based on the driving voltage and the latency, which are measured at a production stage of the memory, satisfies a specified condition; and storing the attribute data to correspond to the specified value based on a result of the determining whether the data transmission satisfies the specified condition.

The determining of whether the data transmission satisfies the specified condition may include, based on at least one of the data transmission performed at an arbitrary driving voltage included in a specified first range and arbitrary latency included in a specified second range failing, determining that the data transmission satisfies the specified condition.

The method of claim 11 may further include, based on the software error occurring, storing the software error occurrence history in the memory.

According to one or more embodiments, in an actual use environment of an electronic device different from a production environment of a memory, the electronic device may identify defects related to a memory margin configuration. The electronic device may improve defects related to a memory margin configuration even after a memory production stage, by identifying defects related to the memory margin configuration in the actual use environment.

According to one or more embodiments, the electronic device may improve the memory margin of a memory by performing memory training. The electronic device may solve the defects related to the memory margin configuration and may stably perform data transmission between the memory and the processor by improving the memory margin.

In addition, a variety of effects directly or indirectly understood through the specification may be provided.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Hereinafter, various embodiments of the disclosure will be described with reference to accompanying drawings. However, those of ordinary skill in the art will recognize that modification, equivalent, and/or alternative on various embodiments described herein may be variously made without departing from the scope and spirit of the disclosure.

Figure 1:
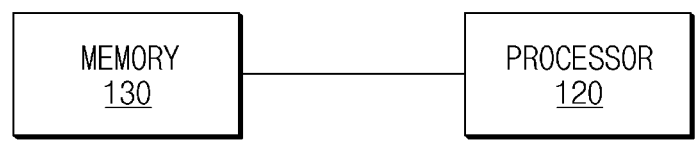
FIG. 1 is a block diagram illustrating hardware of an electronic device, according to one or more embodiments.

FIG. 1 is a block diagram illustrating hardware of an electronic device 101, according to one or more embodiments.

Referring to FIG. 1, the electronic device 101 may include a memory 130 and a processor 120. The memory 130 may be operatively connected to the processor 120.

For example, the processor 120 may execute software (e.g., a program) to control at least another component (e.g., hardware or software component) of the electronic device 101 connected to the processor 120, and may process and calculate various types of data. As at least part of data processing or calculations, the processor 120 may store instructions or data received from another component in the memory 130 (e.g., a volatile memory), may process the instructions or data stored in the memory 130, and/or may store the result data in the memory 130 (e.g., a nonvolatile memory).

The memory 130 may store various pieces of data used by at least one component (e.g., the processor 120) of the electronic device 101. For example, data may include software and input data or output data for instructions associated with the software. The memory 130 may include a volatile memory or a nonvolatile memory.

The memory 130 may store a memory training result. The memory training result may include information about a margin graph corresponding to a memory margin after memory training. The memory margin may include information about a condition (e.g., a reference voltage of a memory and latency of the memory) under which data communication between the memory 130 and the processor 120 is made. The memory margin may correspond to an area specified by a user or an area preset on a system from among areas on a margin graph in which data communication between the memory 130 and the processor 120 is successful.

Figure 3:
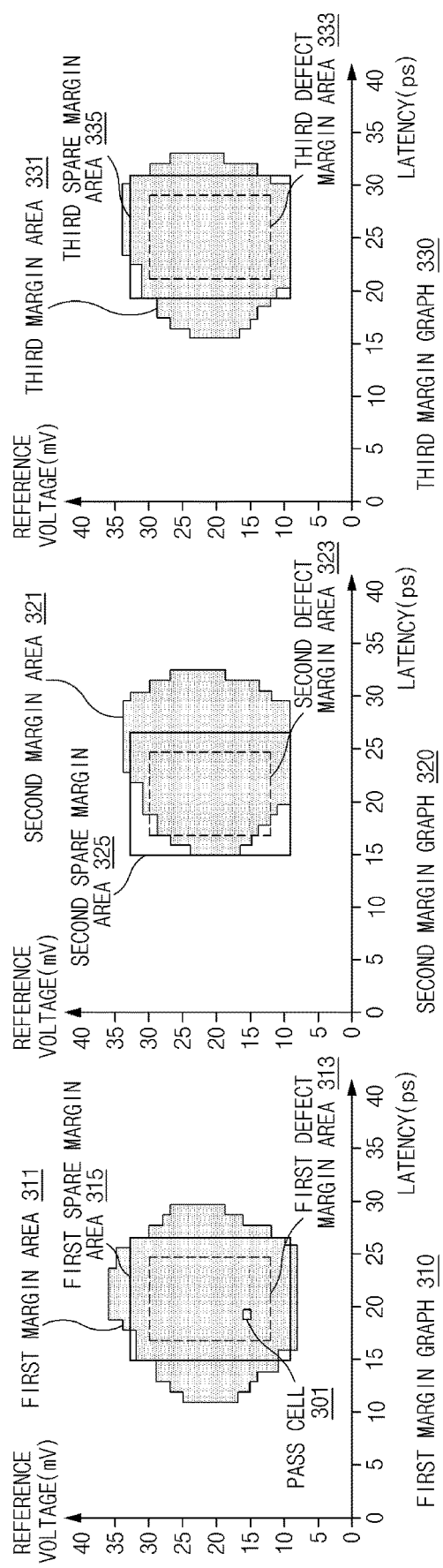
FIG. 3 is a diagram of a margin graph illustrating a memory margin of a memory, according to one or more embodiments.

Information about the margin graph may include information about a margin area (e.g., a first margin area 311, a second margin area 321, or a third margin area 331 in FIG. 3), a spare margin area (e.g., a first spare margin area 315, a second spare margin area 325, or a third spare margin area 335 in FIG. 3), and a defect margin area (e.g., a first defect margin area 313, a second defect margin area 323, or a third defect margin area 333 in FIG. 3). A detailed description of information about the margin graph will be described later with reference to FIG. 3.

The memory 130 may store attribute data. The attribute data may include information about whether the electronic device 101 corresponds to a weak device. The weak device may correspond to the electronic device 101 whose memory margin for the memory 130 does not satisfy a specified condition. For example, the weak device may correspond to the electronic device 101 in which data communication between the memory 130 and the processor 120 fails at an arbitrary reference voltage within the spare margin area and any latency within the spare margin area. The memory 130 may store attribute data as a value of "true" or "false" depending on whether the electronic device 101 is a weak device. A detailed description of the specified condition will be described later with reference to FIG. 3.

The memory 130 may store an occurrence history of software errors. The occurrence history of software errors may include information about software errors occurring in the electronic device 101. The information about software errors occurring in the electronic device 101 may include register information, snapshots, and/or logs.

The processor 120 may determine whether the electronic device 101 corresponds to a weak device, based on a memory training result stored in the memory 130. The memory training result may include information about a margin graph corresponding to a memory margin after memory training. Information about the margin graph may include a margin area, a spare margin area, and/or a defect margin area. The memory training may be performed by testing transmission of data between a memory (e.g., memory 130) and a processor (e.g., processor 120) to determine one or more latency values and one or more corresponding reference voltages at which a successful transmission occurs.

For example, when the margin area includes the defect margin area, and the margin area does not include the spare margin area, the processor 120 may determine that the electronic device 101 corresponds to a weak device. In one or more examples, when the margin area included in the information about the margin graph includes the defect margin area and the spare margin area, the processor 120 may determine that the electronic device 101 does not correspond to a weak device. In one or more examples, when the margin area does not include both the defect margin area and the spare margin area, the processor 120 may determine that the memory 130 included in the electronic device 101 is defective.

The processor 120 may store, in the memory 130, a weak device identification result (e.g., attribute data) including information about whether the electronic device 101 corresponds to a weak device. The weak device identification result may correspond to a value of "true" or "false" depending on whether the electronic device 101 corresponds to a weak device. For example, when the electronic device 101 corresponds to a weak device, a value of the weak device identification result may be "true". In one or more examples, when the electronic device 101 does not correspond to a weak device, the value of the weak device identification result may be "false". However, these scenarios are only examples, and various embodiments are not limited thereto. For example, when the electronic device 101 corresponds to a weak device, the value of the weak device identification result may be false. When the electronic device 101 does not correspond to a weak device, the value of the weak device identification result may be "true".

The processor 120 may determine whether the electronic device 101 corresponds to a weak device, based on the value of the weak device identification result stored in the memory 130.

With respect to an arbitrary latency and an arbitrary reference voltage, the processor 120 may generate, as a two-dimensional graph, a margin graph indicating whether data transmission between the memory 130 and the processor 120 is successful. The processor 120 may identify, on the margin graph, a margin area in which data transmission between the memory 130 and the processor 120 is successful. The margin area may include at least one pass cell. With respect to an arbitrary reference voltage and arbitrary latency, the pass cell may correspond to a unit cell in which data transmission between the memory 130 and the processor 120 is successful. A unit cell may correspond to a rectangular area having a horizontal length, which is the minimum unit of latency being a horizontal axis on the margin graph, and a vertical length, which is the minimum unit of the reference voltage being a vertical axis on the margin graph.

The processor 120 may perform memory training on the memory 130 to improve a memory margin. The processor 120 may improve the memory margin by moving the defect margin area and the spare margin area such that all unit cells in the defect margin area correspond to pass cells and the spare margin area includes as many pass cells as possible through memory training. The processor 120 may perform data communication between the memory 130 and the processor 120 by using the reference voltage and latency corresponding to a pass cell included in either the defect margin area after the move and/or the spare margin area after the move. The processor 120 may perform the memory training such that data communication between the memory 130 and the processor 120 is performed stably.

The defect margin area may be set based on characteristics of the processor 120, characteristics of the memory 130, and/or the combination of characteristics of the processor 120 and characteristics of the memory 130. When the margin area includes the defect margin area, for example, when all unit cells within the defect margin area are pass cells, the memory 130 may operate normally. When the margin area does not include the defect margin area, for example, when there is a unit cell other than a pass cell within the defect margin area, the memory 130 may be determined as defective.

The spare margin area may correspond to an area where, on a basis of a center point of the defect margin area, a length of the defect margin area in a horizontal axis direction is increased by a first ratio and a length of the defect margin area in a vertical axis direction is increased by a second ratio. When the margin area includes the spare margin area, for example, when all unit cells in the spare margin area are pass cells, the electronic device 101 may not correspond to a weak device. When the margin area does not include the spare margin area, for example, when there is a unit cell other than a pass cell within the spare margin area, the electronic device 101 may correspond to a weak device.

The processor 120 may store information about a software error occurring in the electronic device 101 under a specified condition in the memory 130, as an occurrence history of software errors. For example, the specified condition may correspond to a case where a software error occurs in the electronic device 101 and the electronic device 101 is a weak device. For example, the information about the software error occurring in the electronic device 101 may include register information, snapshots, and/or logs.

The processor 120 may identify a defect related to a memory margin configuration. When identifying the defect related to the memory margin configuration, the processor 120 may refer to the an occurrence history of software errors. The software errors may be related to the memory margin and may have occurred in the electronic device 101.

To use the occurrence history of software errors the processor 120 may transmit a signal for requesting the occurrence history of software errors to the memory 130. The processor 120 may receive the occurrence history of software errors related to a memory margin from the memory 130.

The processor 120 may identify defects related to a memory margin configuration based on the occurrence history of software errors received from the memory 130 and software errors occurring in the electronic device 101.

The processor 120 may identify the number of times that a software error related to a memory margin occurs based on the occurrence history of software errors and the software errors occurring in the electronic device 101. For example, the processor 120 may identify the number of times that a software error related to a memory margin occurs by adding 1, which is the number of software errors occurring in the electronic device, to the number of software errors included in the occurrence history of software errors.

The processor 120 may determine whether the number of times that a software error related to a memory margin occurs is greater than or equal to a threshold count. When the number of times that a software error related to a memory margin occurs is greater than or equal to the threshold count, the processor 120 may determine that a defect related to a memory margin configuration occurs in the memory 130. The threshold count may be the number of times specified on a system (e.g., predetermined value stored in memory of system) or the number of times specified by a user. For example, the threshold count may be 3 times.

On the basis of a first detected state occurring in the memory 130 due to a software error (e.g., a first software error) occurring in the electronic device 101, and a second detected state occurring in the memory 130 due to a software error (e.g., a second software error) included in the occurrence history of software errors, the processor 120 may determine whether a defect related to a memory margin configuration occurs in the memory 130.

When the first detected state is the same as the second detected state, and a first log stored in the memory 130 with respect to the occurrence history of the first software error is different from a second log stored in the memory 130 with respect to the occurrence history of the second software error, the processor 120 may determine that a defect related to the memory margin configuration occurs in the memory 130. For example, when both the first detected state and the second detected state are in a list corruption state, and a call stack of the first log is different from a call stack of the second log, the processor 120 may determine that a defect related to a memory margin configuration occurs in the memory 130. The list corruption state may be stored in the memory 130.

When the first detected state is different from the second detected state, the processor 120 may determine that a defect related to a memory margin configuration occurs in the memory 130. For example, when the first detected state is in a list corruption and the second detected state corresponds to paging request fail, the processor 120 may determine that a defect related to a memory margin configuration occurs in the memory 130.

The processor 120 may determine whether the defect related to the memory margin configuration occurs in the memory 130 based on the number of times that a software error related to a memory margin occurs and an error state of the memory 130 caused by a software error occurring in the electronic device 101.

The processor 120 may store a defect identification result related to a memory margin configuration of different values (e.g., "true" or "false") in the memory 130 depending on whether the memory 130 has a defect related to the memory margin configuration. For example, when the processor 120 determines that a defect related to a memory margin configuration occurs in the memory 130, the processor 120 may store a value of the defect identification result related to the memory margin configuration as "true" in the memory 130. In one or more examples, when the processor 120 determines that a defect related to a memory margin configuration occurs in the memory 130, the processor 120 may store a value of the defect identification result related to the memory margin configuration as "false" in the memory 130.

The processor 120 may identify or determine a defect related to a memory margin configuration in an actual use environment of the electronic device 101 different from a production environment of the memory 130. Accordingly, even after the production stage of the memory 130, the processor 120 may perform memory training on the memory 130, thereby improving the defect related to the memory margin configuration.

The processor 120 may perform memory training on the memory 130 to improve a memory margin. The processor 120 may improve the memory margin by moving the defect margin area and the spare margin area such that all unit cells in the defect margin area correspond to pass cells, and the spare margin area includes as many pass cells as possible through memory training. The processor 120 may perform data communication between the memory 130 and the processor 120 by using the reference voltage and latency corresponding to the pass cell included in either the defect margin area after the move and/or the spare margin area after the move. The processor 120 may perform the memory training such that data communication between the memory 130 and the processor 120 is performed stably.

Figure 2:
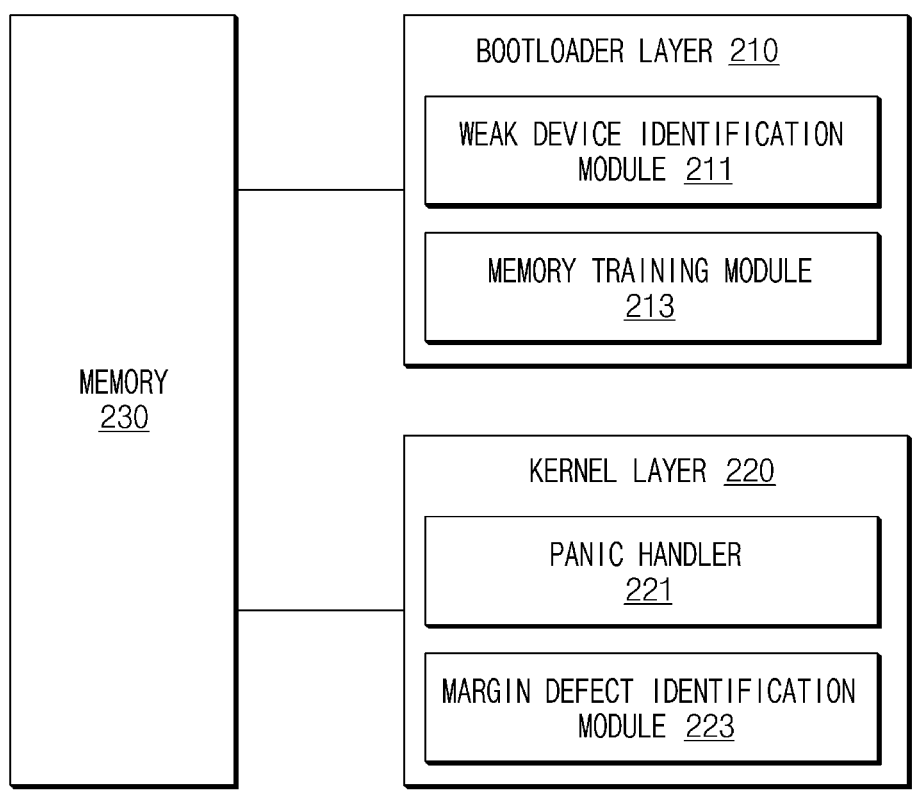
FIG. 2 is a diagram for describing a software layer and hardware of an electronic device, according to one or more embodiments.

FIG. 2 is a diagram for describing a software layer and hardware of an electronic device 201 (e.g., the electronic device 101 in FIG. 1), according to one or more embodiments.

An operation in which one module (e.g., a first module) included in FIG. 2 transmits a signal to another module (e.g., a second module) may include an operation in which the first module directly transmits a signal to the second module, an operation in which the first module transmits a signal to a processor (e.g., the processor 120 in FIG. 1), and the processor transmits a signal to the second module, an operation in which the first module stores signal-related information in the memory 230 (e.g., the memory 130 in FIG. 1) and the second module reads signal-related information from the memory 230 and performs an operation on the signal, and/or an operation in which the first module stores signal-related information in the memory 230, and the processor reads signal-related information from the memory 230 and commands the second module to perform an operation regarding the signal.

The electronic device 201 may include a software layer and hardware for executing the software. For example, the software layer may include a bootloader layer 210 and a kernel layer 220. When the user boots the electronic device 201, the bootloader layer 210 may correspond to a layer executed before an operating system of the electronic device 201 is started. The bootloader layer 210 may perform a task necessary for the kernel layer 220 to start normally and may start the operating system. The kernel layer 220 may correspond to a layer connecting the hardware of the electronic device 201 and a processor. The kernel layer 220 may distribute hardware resources to processes requiring resources, may control processes and memory, and may execute instructions requested by a program to the operating system. In one or more examples, the hardware may include the memory 230 and a processor. The software layer is not limited to the above-described layer and may include one or more additional layers. For example, the software layer may further include at least one of a library layer, an android runtime layer, an android framework layer, and an application layer.

The bootloader layer 210 may include a weak device identification module 211 and a memory training module 213. The above-described configuration of the modules are merely an example, and as understood by one of ordinary skill in the art, the bootloader layer 210 may include one or more additional modules.

The weak device identification module 211 may determine whether the electronic device 201 corresponds to a weak device based on a memory training result stored in the memory 230. The weak device may correspond to the electronic device 201 whose memory margin for the memory 230 does not satisfy a specified condition. For example, the weak device may correspond to the electronic device 201 in which data communication between the memory 230 and a processor fails at an arbitrary reference voltage within the spare margin area and any latency within the spare margin area. The memory training result may include information about a margin graph corresponding to a memory margin after memory training. Information about the margin graph may include a margin area, a spare margin area, and/or a defect margin area.

For example, when the margin area includes the defect margin area and the margin area does not include the spare margin area, the weak device identification module 211 may determine that the electronic device 201 corresponds to a weak device. In one or more examples, when the margin area included in the information about the margin graph includes the defect margin area and the spare margin area, the weak device identification module 211 may determine that the electronic device 201 does not correspond to a weak device. In one or more examples, when the margin area does not include both the defect margin area and the spare margin area, the weak device identification module 211 may determine that the memory 230 included in the electronic device 201 is defective.

The weak device identification module 211 may return, to the processor, a weak device identification result (e.g., attribute data) including information about whether the electronic device 201 corresponds to a weak device. The weak device identification result may correspond to a value of "true" or "false" depending on whether the electronic device 201 corresponds to a weak device. For example, when the electronic device 201 corresponds to a weak device, a value of the weak device identification result may be "true". In one or more examples, when the electronic device 201 corresponds to a weak device, a value of the weak device identification result may be false.

With respect to arbitrary latency and an arbitrary reference voltage, the memory training module 213 may generate, as a two-dimensional graph, a margin graph indicating whether data transmission between the memory 230 and the processor is successful. The memory training module 213 may identify, on the margin graph, a margin area in which data transmission between the memory 230 and the processor is successful. The margin area may include at least one pass cell. With respect to an arbitrary reference voltage and arbitrary latency, the pass cell may correspond to a unit cell in which data transmission between the memory 230 and the processor is successful. A unit cell may correspond to a rectangular area having a horizontal length, which is the minimum unit of latency being a horizontal axis on the margin graph, and a vertical length, which is the minimum unit of the reference voltage being a vertical axis on the margin graph.

The defect margin area may be set based on characteristics of the processor, characteristics of the memory 230, and/or the combination of characteristics of the processor and characteristics of the memory 230. When the margin area includes the defect margin area, for example, when all unit cells within the defect margin area are pass cells, the memory 230 may operate normally. When the margin area does not include the defect margin area, for example, when there is a unit cell other than a pass cell within the defect margin area, the memory 230 may be determined as defective.

The spare margin area may correspond to an area where, on a basis of a center point of the defect margin area, a length of the defect margin area in a horizontal axis direction is increased by a first ratio and a length of the defect margin area in a vertical axis direction is increased by a second ratio. When the margin area includes the spare margin area, for example, when all unit cells in the spare margin area are pass cells, the electronic device 201 may not correspond to a weak device. When the margin area does not include the spare margin area, for example, when there is a unit cell other than a pass cell within the spare margin area, the electronic device 201 may correspond to a weak device.

The memory training module 213 may perform memory training on the memory 230 to improve a memory margin. The memory training module 213 may improve the memory margin by moving the defect margin area and the spare margin area such that all unit cells in the defect margin area correspond to pass cells and the spare margin area includes as many pass cells as possible through memory training. The memory training module 213 may perform data communication between the memory 230 and the processor by using the reference voltage and latency corresponding to a pass cell included in either the defect margin area after the defect margin area is moves and/or the spare margin area after the spare margin area is moved. The memory training module 213 may perform the memory training such that data communication between the memory 230 and the processor is performed stably.

The kernel layer 220 may include a panic handler 221 and a margin defect identification module 223. The above-described modules are for only illustrative purposes, and the kernel layer 220 may include one or more additional modules to the above-described modules.

The panic handler 221 may store information about a software error occurring in the electronic device 201 under a specified condition in the memory 230 as an occurrence history of software errors. For example, the specified condition may correspond to a case where a software error occurs in the electronic device 201 and the electronic device 201 is a weak device. For example, the information about the software error occurring in the electronic device 201 may include register information, snapshots, and/or logs.

The margin defect identification module 223 may identify a defect related to a memory margin configuration. When identifying the defect related to the memory margin configuration, the margin defect identification module 223 may refer to the occurrence history of software errors, which are related to the memory margin and which have occurred in the electronic device 201.

To use the occurrence history of software errors related to the memory margin and have occurred in the electronic device 201, the margin defect identification module 223 may transmit a signal for requesting the occurrence history of software errors to the memory 230, and may receive the occurrence history of software errors related to a memory margin from the memory 230.

The margin defect identification module 223 may identify defects related to a memory margin configuration based on the occurrence history of software errors received from the memory 230 and software errors occurring in the electronic device 201.

The margin defect identification module 223 may identify the number of times that a software error related to a memory margin occurs, based on the occurrence history of software errors and the software errors occurring in the electronic device 201. For example, the margin defect identification module 223 may identify the number of times that a software error related to a memory margin occurs by adding 1 to the number of software errors included in the occurrence history of software errors.

The margin defect identification module 223 may determine whether the number of times that a software error related to a memory margin occurs is greater than or equal to a threshold count. When the number of times that a software error related to a memory margin occurs is greater than or equal to the threshold count, the margin defect identification module 223 may determine that a defect related to a memory margin configuration occurs in the memory 230. The threshold count may be the number of times specified on a system (e.g., predetermined parameter stored in memory) or the number of times specified by a user. For example, the threshold count may be 3 times.

On the basis of a first detected state of the memory 230 caused due to a software error (e.g., a first software error) occurring in the electronic device 201 and a second detected state of the memory 230 caused due to a software error (e.g., a second software error) included in the occurrence history of software errors, the margin defect identification module 223 may determine whether a defect related to a memory margin configuration occurs in the memory 230. The first detected state may correspond to an error phenomenon occurring in the memory 230 due to the first software error. The second detected state may correspond to an error phenomenon occurring in the memory 230 due to the second software error. An error phenomenon may be a failure to transmit data from the memory to the processor or from the processor to the memory.

For example, when the first detected state is the same as the second detected state, and the first log stored in the memory 230 with respect to the occurrence history of the first software error is different from the second log stored in the memory 230 with respect to the occurrence history of the second software error, the margin defect identification module 223 may determine that a defect related to the memory margin configuration occurs in the memory 230. In one or more examples, when the first detected state is different from the second detected state, the margin defect identification module 223 may determine that a defect related to a memory margin configuration occurs in the memory 230.

The margin defect identification module 223 may determine whether the defect related to the memory margin configuration occurs in the memory 230, based on the number of times that a software error related to a memory margin occurs and an error state of the memory 230 caused by a software error occurring in the electronic device 201.

The margin defect identification module 223 may store a defect identification result related to a memory margin configuration of different values (e.g., "true" or "false") in the memory 230 depending on whether the memory 230 has a defect related to the memory margin configuration. For example, when the margin defect identification module 223 determines that a defect related to a memory margin configuration occurs in the memory 230, the margin defect identification module 223 may store a value of the defect identification result related to the memory margin configuration as "true" in the memory 230. For example, when the margin defect identification module 223 determines that a defect related to a memory margin configuration occurs in the memory 230, the margin defect identification module 223 may store a value of the defect identification result related to the memory margin configuration as "false" in the memory 230.

The margin defect identification module 223 may identify a defect related to a memory margin configuration in an actual use environment of the electronic device 201 different from a production environment of the memory 230. Accordingly, even after the production stage of the memory 230, the margin defect identification module 223 may perform memory training on the memory 230, thereby improving the defect related to the memory margin configuration.

The memory 230 may store a memory training result. The memory training result may include information about a margin graph corresponding to a memory margin after memory training. Information about the margin graph may include information about a margin area, a spare margin area, and/or a defect margin area.

The memory 230 may store attribute data. The memory 230 may store attribute data as a value of "true" or "false" depending on whether the electronic device 201 is a weak device.

The memory 230 may store the occurrence history of software errors. The occurrence history of software errors may include information about software errors occurring in the electronic device 201. The information about software errors occurring in the electronic device 201 may include register information, snapshots, and/or logs.

FIG. 3 is a diagram of a margin graph illustrating a memory margin of a memory, according to one or more embodiments.

A margin graph may correspond to a two-dimensional graph indicating whether data transmission between a memory (e.g., the memory 130 in FIG. 1 or the memory 230 in FIG. 2) and a processor (e.g., the processor 120 in FIG. 1 or the processor in FIG. 2) is successful (pass), by using a reference voltage of a memory and latency of the memory as variables.

A horizontal axis of the margin graph may indicate the latency of data transmission between the memory and the processor. The unit of the latency may be picoseconds (ps). A vertical axis of the margin graph may indicate the reference voltage of data transmission between a memory and a processor. The unit of the reference voltage may be millivolt (mV).

The margin area of the margin graph may correspond to an area where data transmission between the memory and the processor is successful. The margin area may include at least one pass cell 301. As understood by one of ordinary skill in the art, the margin area may include a plurality of pass cells each having a size corresponding to pass cell 301. With respect to an arbitrary reference voltage and arbitrary latency, the pass cell 301 may correspond to a unit cell in which data transmission between the memory and the processor is successful. A unit cell may correspond to a rectangular area having a horizontal length, which is the minimum unit of latency on a horizontal axis on the margin graph, and a vertical length, which is the minimum unit of the reference voltage on a vertical axis on the margin graph.

For example, when data transmission between a memory and a processor is successful, a unit cell to which a first reference voltage and first latency belong may correspond to the pass cell 301. In one or more examples, when data transmission between a memory and a processor fails, a unit cell to which a second reference voltage and second latency belong may not correspond to the pass cell 301 with respect to the second reference voltage and the second latency.

The defect margin area of a margin graph may be set based on characteristics of the processor, characteristics of the memory, and/or the combination of characteristics of the processor and characteristics of the memory.

The processor may determine whether the memory is defective, based on whether the margin area includes the defect margin area. For example, when the margin area includes the defect margin area, for example, when all unit cells within the defect margin area correspond to the pass cell 301 (e.g., an entire area of the defect margin area is in the margin area), the processor may determine that the memory is normal. In one or more examples, when the margin area does not include an entirety of the defect margin area, for example, when there is at least one unit cell other than the pass cell 301 within the defect margin area and outside of the margin area, the processor may determine that the memory is defective. When the margin area includes an entirety of the defect margin area, the processor may determine that the memory margin satisfies a first condition. For example, the defect margin area may be composed of a plurality of unit cells, and when each unit cell of the defect margin area is included in the margin area, the first condition is satisfied.

The spare margin area of a margin graph may correspond to an area where, on a basis of a center point of the defect margin area, a length of the defect margin area in a horizontal axis direction is increased by a first ratio and a length of the defect margin area in a vertical axis direction is increased by a second ratio. For example, when a length of the horizontal axis of the defect margin area is 40 ps, a length of the vertical axis of the defect margin area is 60 mV, a first ratio is 15%, and a second ratio is 15%, the center point of the spare margin area may coincide with the center point of the defect margin area, a length in the horizontal axis direction may be 46 ps, and a length in the vertical axis direction may correspond to an area of 69 mV. Therefore, the spare margin area may be determined based on the dimensions of the defect margin area.

The processor may determine whether the electronic device is a weak device, based on whether the margin area includes a spare margin area. For example, when the margin area includes the spare margin area, for example, when all unit cells within the spare margin area correspond to the pass cell 301 (e.g., an entire area of the spare margin area is within the margin area), the processor may determine that the electronic device is not a weak device. In one or more examples, when the margin area does not include an entirety of the spare margin area, for example, when at least one unit cell other than the pass cell 301 is present within the spare margin area, the processor may determine that the electronic device is a weak device. When the margin area includes an entirety of the spare margin area, the processor may determine that the memory margin satisfies a second condition. For example, the spare margin area may be composed of a plurality of unit cells, and when each unit cell of the spare margin area is included in the margin area, the second condition is satisfied.

The margin graph may include a first margin graph 310, a second margin graph 320, and a third margin graph 330. The first margin graph 310, the second margin graph 320, and the third margin graph 330 may be margin graphs corresponding to memory margins of memories at different time points, respectively.

The first margin graph 310 may be a margin graph corresponding to a memory margin after memory training is performed in a production environment of a memory. The first margin area 311 of the first margin graph 310 may include the pass cell 301 in which data transmission between the memory and the processor is successful in the memory production environment. Each unit cell included in the first margin graph 310 may correspond to the pass cell.

The first margin area 311 may include the first defect margin area 313 and may not include an entirety of the first spare margin area 315 (e.g., the first spare margin area 315 includes at least one unit cell not included in the first margin area 311). The processor may determine that the memory margin corresponding to the first margin graph 310 satisfies the first condition and does not satisfy the second condition based on the first margin area 311 including the first defect margin area 313. The processor may determine that an electronic device having a memory margin, which satisfies the first condition and does not satisfy the second condition, is a weak device.

The second margin graph 320 may be a margin graph corresponding to a memory margin in an environment (hereinafter referred to as an "actual use environment") in which a user actually employs an electronic device. The actual use environment of an electronic device and the production environment of a memory may have different environmental conditions from each other. For example, the environmental condition may be different from the actual use environment based on ambient temperature, ambient humidity, or use time of the electronic device.

As the physical characteristics of a memory are changed because the production environment of a memory is different from the actual use environment of an electronic device, whether data transmission between a memory and a processor is successful in one unit cell may vary. For example, because the pass cell on the margin graph in the production environment of a memory is different from the pass cell on the margin graph in the actual use environment of an electronic device, a margin area (e.g., the first margin area 311) in the memory production environment may be different from a margin area (e.g., the second margin area 321) in the actual use environment of the electronic device.

The second margin area 321 may not include the second defect margin area 323. For example, the second defect margin area 323 may include at least one unit cell other than the pass cell 301 (e.g., at least one unit cell of the second defect margin area 323 is not included in the second margin area 321). The processor may determine that the memory margin corresponding to the second margin graph 320 does not satisfy the first condition. As the second margin area 321 does not include an entirety of the second defect margin area 323, a software error related to a memory margin may occur in an electronic device.

After memory training is performed in the actual use environment of the electronic device, the third margin graph 330 may be a margin graph corresponding to the improved memory margin. The processor may improve the memory margin through memory training. The third margin area 331 may correspond to the second margin area 321.

For example, the processor may perform memory training such that the second defect margin area 323 of the second margin graph 320 corresponds to the third defect margin area 333 of the third margin graph 330. In one or more examples, the processor may perform memory training such that the second spare margin area 325 of the second margin graph 320 corresponds to the third spare margin area 335 of the third margin graph 330. As illustrated in FIG. 3, an entirety of the third defect margin area 333 is included in the third margin area 331, thereby resulting in improved memory margin based on memory training in an actual use environment.

Through the memory training, the processor may improve the memory margin of a memory. The processor may improve the memory margin such that data transmission of data between the memory and the processor is made stably.

Figure 4:
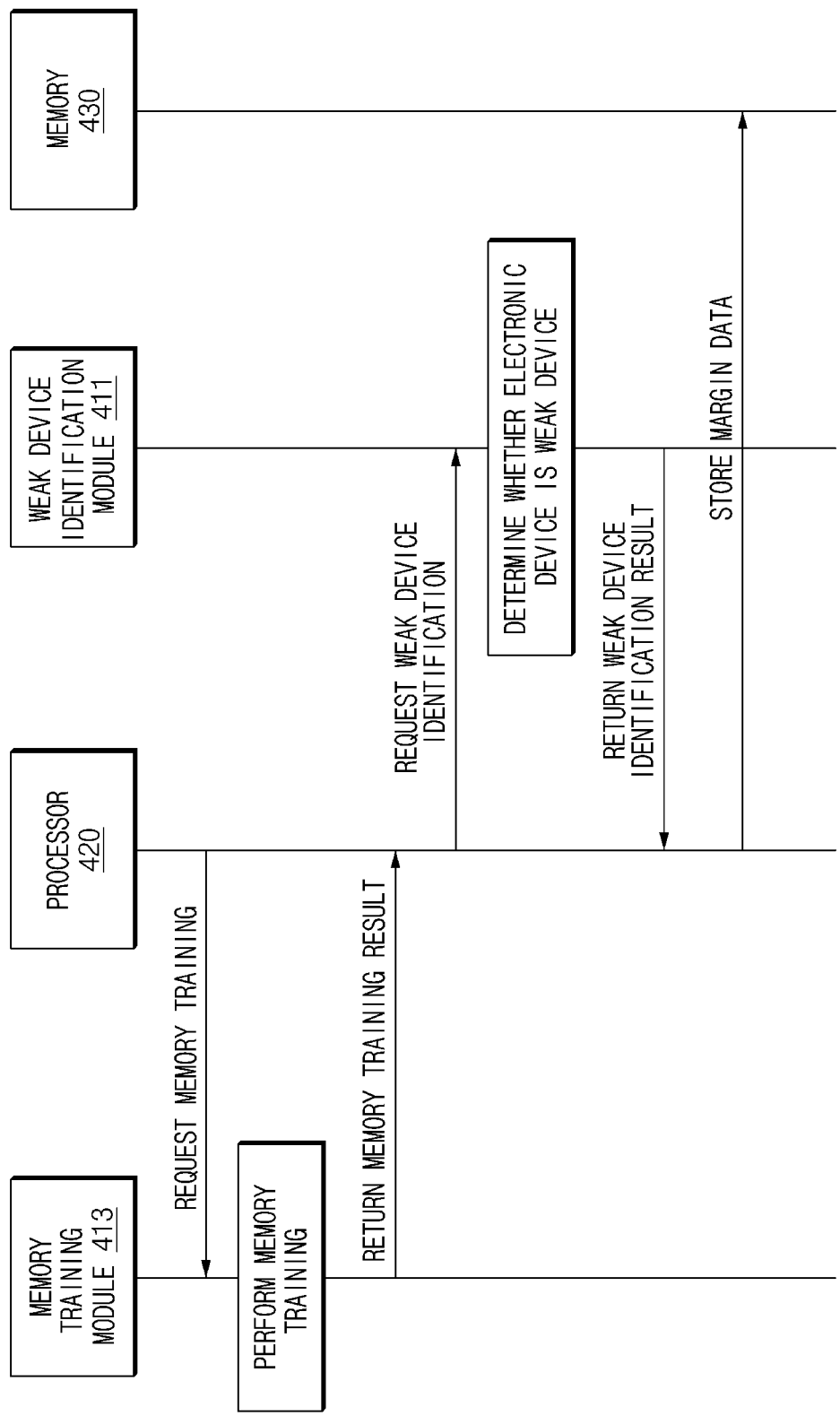
FIG. 4 is a signal flowchart of components included in an electronic device, according to one or more embodiments.

FIG. 4 is a signal flowchart of components included in an electronic device, according to one or more embodiments.

Referring to FIG. 4, a series of operations for an electronic device (e.g., the electronic device 101 in FIG. 1, the electronic device 201 in FIG. 2, or the electronic device in FIG. 3) to store attribute data in a memory 430 (e.g., the memory 130 in FIG. 1, the memory 230 in FIG. 2, or the memory in FIG. 3) may be described. The electronic device may store a value of attribute data as "true" or "false" in the memory 430 depending on whether the electronic device is a weak device (e.g., the weak device in FIG. 3).

A processor 420 (e.g., the processor 120 in FIG. 1, the processor in FIG. 2, or the processor in FIG. 3) may transmit a signal for making a request for memory training on the memory 430 to a memory training module 413 (e.g., the memory training module 213 in FIG. 2). The memory training module 413 may receive a signal for requesting memory training from the processor 420, and may perform memory training on the memory 430. The memory training module 413 may return the memory training result according to the performed memory training to the processor 420. The memory training result may include information about a margin graph corresponding to a memory margin after memory training. Information about the margin graph may include information about a margin area, a spare margin area, and/or a defect margin area.

The processor 420 may transmit a signal for determining whether an electronic device is a weak device, to the weak device identification module 411 based on the memory training result received from the memory training module 413 (e.g., the weak device identification module 211). The processor 420 may transmit, to the weak device identification module 411, a signal for determining whether an electronic device is a weak device, and information about a margin graph received from the memory training module 413.

The weak device identification module 411 may determine whether the electronic device corresponds to a weak device, based on the signal for determining whether the electronic device is a weak device, which is received from the processor 420. The weak device identification module 411 may determine whether the electronic device corresponds to a weak device, based on the information about the margin graph received from the processor 420.

For example, when the margin area included in the information about the margin graph includes the defect margin area and the margin area does not include the spare margin area, the weak device identification module 411 may determine that the electronic device corresponds to a weak device. In one or more examples, when the margin area included in the information about the margin graph includes the defect margin area and the spare margin area, the weak device identification module 411 may determine that the electronic device does not correspond to a weak device. In one or more examples, when the margin area included in the information about the margin graph does not include both the defect margin area and the spare margin area, the weak device identification module 411 may determine that the memory 430 included in the electronic device is defective.

The weak device identification module 411 may return, to the processor 420, the weak device identification result including information about whether the electronic device corresponds to a weak device. The weak device identification result may correspond to a value of "true" or "false" depending on whether the electronic device corresponds to a weak device. For example, when the electronic device corresponds to a weak device, a value of the weak device identification result may be "true". In one or more examples, when the electronic device corresponds to a weak device, a value of the weak device identification result may be "false". Hereinafter, for convenience of description, when the electronic device corresponds to a weak device, a value of the weak device identification result is assumed to be "true".

When the weak device identification result received from the weak device identification module 411 is "true", the processor 420 may store attribute data as "true" in the memory 430. The attribute data may be stored as "true" or "false" in the memory 430 depending on whether the electronic device is a weak device. For example, when the electronic device is a weak device, the processor 420 may store the attribute data as "true" in the memory 430. In one or more examples, when the electronic device is a weak device, the processor 420 may store the attribute data as "false" in the memory 430. Hereinafter, for convenience of description, when the electronic device is a weak device, it is assumed that the processor 420 stores the attribute data as "true" in the memory 430.

Figure 5:
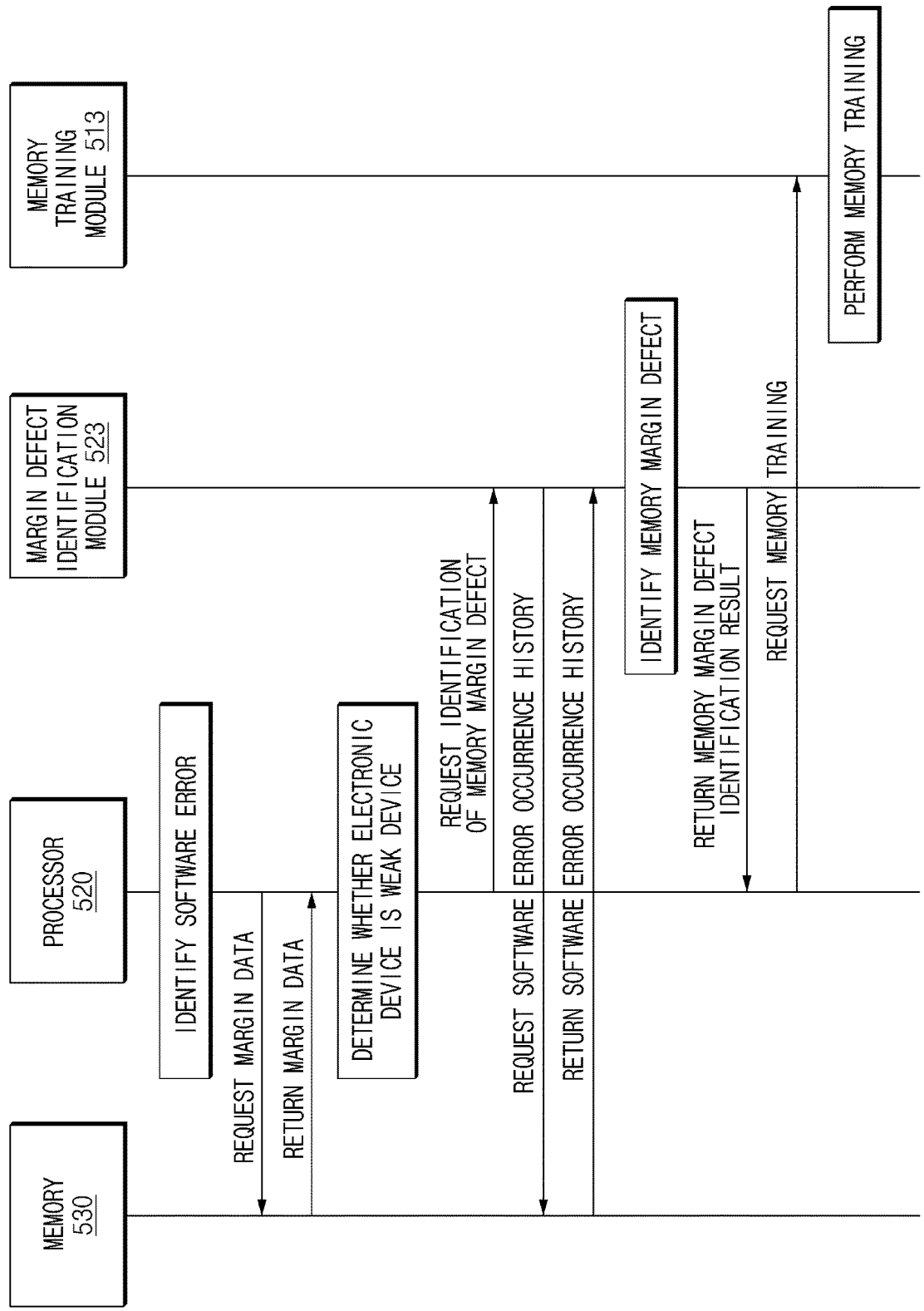
FIG. 5 is a signal flowchart of components included in an electronic device, according to one or more embodiments.

FIG. 5 is a signal flowchart of components included in an electronic device, according to one or more embodiments.

Referring to FIG. 5, an electronic device (e.g., the electronic device 101 in FIG. 1, the electronic device 201 in FIG. 2, the electronic device in FIG. 3, or the electronic device in FIG. 4) may determine whether a software error is an error associated with a memory margin when the software error occurs in an electronic device, and may perform memory training when the software error is the error associated with the memory margin. Accordingly, a series of operations for improving a memory margin may be described.

A processor 520 (e.g., the processor 120 in FIG. 1, the processor in FIG. 2, the processor in FIG. 3, or the processor 420 in FIG. 4) may identify a software error occurring in an electronic device. The software error may include an error occurring in relation to a memory margin and/or an error occurring regardless of the memory margin. For example, the error occurring in relation to the memory margin may include list corruption, paging request fail, and/or zram decompression fail.

To determine whether the processor 520 is a weak device, an electronic device may transmit a signal for requesting attribute data to a memory 530 (e.g., the memory 130 in FIG. 1, the memory 230 in FIG. 2, the memory in FIG. 3, or the memory 430 in FIG. 4) as a premise for determining whether a software error occurs in relation to a memory margin. The memory 530 may return, to the processor 520, the attribute data based on a signal for requesting the attribute data received from the processor 520.

The processor 520 may determine whether the electronic device is a weak device, based on a value of attribute data. For example, when the value of attribute data is "true", the processor 520 may determine that the electronic device is a weak device. In one or more examples, when the value of attribute data is "false", the processor 520 may determine that the electronic device is a weak device. Hereinafter, for convenience of description, it is assumed that the processor 520 determines that the electronic device is a weak device, when the value of attribute data is "true".

When the processor 520 determines that the electronic device is a weak device, the processor 520 may transmit a signal for requesting identification of a defect related to a memory margin configuration to a margin defect identification module 523 (e.g., the margin defect identification module 223 in FIG. 2).

When the processor 520 determines that the electronic device is a weak device, a panic handler (e.g., the panic handler 221 in FIG. 2) may store information about a software error occurring in an electronic device, as a software error occurrence history in the memory 530. For example, the information about the software error occurring in the electronic device may include register information, snapshots, and/or logs.

The margin defect identification module 523 may receive, from the processor 520, a signal for requesting identification of whether there is a defect associated with a memory margin, and may identify a defect associated with a memory margin configuration. With reference to the occurrence history of software errors related to the memory margin and occurring in the electronic device 201, the margin defect identification module 523 may identify the defect associated with the memory margin configuration.

To use the occurrence history of software errors related to the memory margin and occurring in the electronic device, the margin defect identification module 523 may transmit a signal for requesting the occurrence history of software errors to the memory 530. On the basis of the signal for requesting the occurrence history of software errors received from the margin defect identification module 523, the memory 530 may return the occurrence history of software errors to the margin defect identification module 523.

The margin defect identification module 523 may identify a defect associated with a memory margin configuration based on the occurrence history of software errors received from the memory 530 and software errors occurring in the electronic device.

The margin defect identification module 523 may identify the number of times that a software error related to a memory margin occurs, based on the occurrence history of software errors and the software errors occurring in the electronic device. For example, the margin defect identification module 523 may identify the number of times that a software error related to a memory margin occurs by adding 1 to the number of software errors included in the occurrence history of software errors.

The margin defect identification module 523 may determine whether the number of times that a software error related to a memory margin occurs is greater than or equal to a threshold count. When the number of times that a software error related to a memory margin occurs is greater than or equal to the threshold count, the margin defect identification module 523 may determine that a defect related to a memory margin configuration occurs in the memory 530. The threshold count may be the number of times specified on a system (e.g., predetermined parameter stored in memory) or the number of times specified by a user. For example, the threshold count may be 3 times.

On the basis of a first detected state of the memory 530 caused due to a software error (e.g., a first software error) occurring in the electronic device and a second detected state of the memory 530 caused due to a software error (e.g., a second software error) included in the occurrence history of software errors, the margin defect identification module 523 may determine whether a defect related to a memory margin configuration occurs in the memory 530. The first detected state may correspond to an error phenomenon occurring in the memory 530 due to the first software error. The second detected state may correspond to an error phenomenon occurring in the memory 530 due to the second software error.

For example, when the first detected state is the same as the second detected state, and the first log stored in the memory 530 with respect to the occurrence history of the first software error is different from the second log stored in the memory 530 with respect to the occurrence history of the second software error, the margin defect identification module 523 may determine that a defect related to the memory margin configuration occurs in the memory 530. In one or more examples, when the first detected state is different from the second detected state, the margin defect identification module 523 may determine that a defect related to a memory margin configuration occurs in the memory 530.

The margin defect identification module 523 may determine whether the defect related to the memory margin configuration occurs in the memory 530, based on the number of times that a software error related to a memory margin occurs and an error state of the memory 530 caused by a software error occurring in the electronic device.

The margin defect identification module 523 may return a defect identification result related to memory margin configuration to the processor 520. When the margin defect identification module 523 determines that a defect related to a memory margin configuration occurs in the memory 530, the defect identification result related to the memory margin configuration may correspond to a value of "true" or "false". For example, when the margin defect identification module 523 determines that a defect related to a memory margin configuration occurs in the memory 530, a value of the defect identification result related to the memory margin configuration may correspond to "true". In one or more examples, when the margin defect identification module 523 determines that a defect related to a memory margin configuration occurs in the memory 530, a value of the defect identification result related to the memory margin configuration may correspond to "false". Hereinafter, for convenience of description, when the margin defect identification module 523 determines that a defect related to a memory margin configuration occurs in the memory 530, it is assumed that the value of the defect identification result related to the memory margin configuration corresponds to "true".

The margin defect identification module 523 may identify a defect related to a memory margin configuration in an actual use environment of the electronic device different from a production environment of the memory 530. Accordingly, even after the production stage of the memory 530, a memory training module 513 may perform memory training on the memory 530, thereby improving the defect related to the memory margin configuration.

When the value of the defect identification result related to the memory margin configuration received from the margin defect identification module 523 is "true", the processor 520 may transmit a signal for requesting memory training to the memory training module 513 (e.g., the memory training module 213 of FIG. 2 or the memory training module 413 of FIG. 4).

The memory training module 513 may receive a signal for requesting memory training from the processor 520, and may perform memory training on the memory 530. The memory training module 513 may perform memory training, thereby improving the memory margin of the memory 530. The memory training module 513 may improve a memory margin such that data transmission of data between the memory 530 and the processor 520 is made stably.

Figure 6:
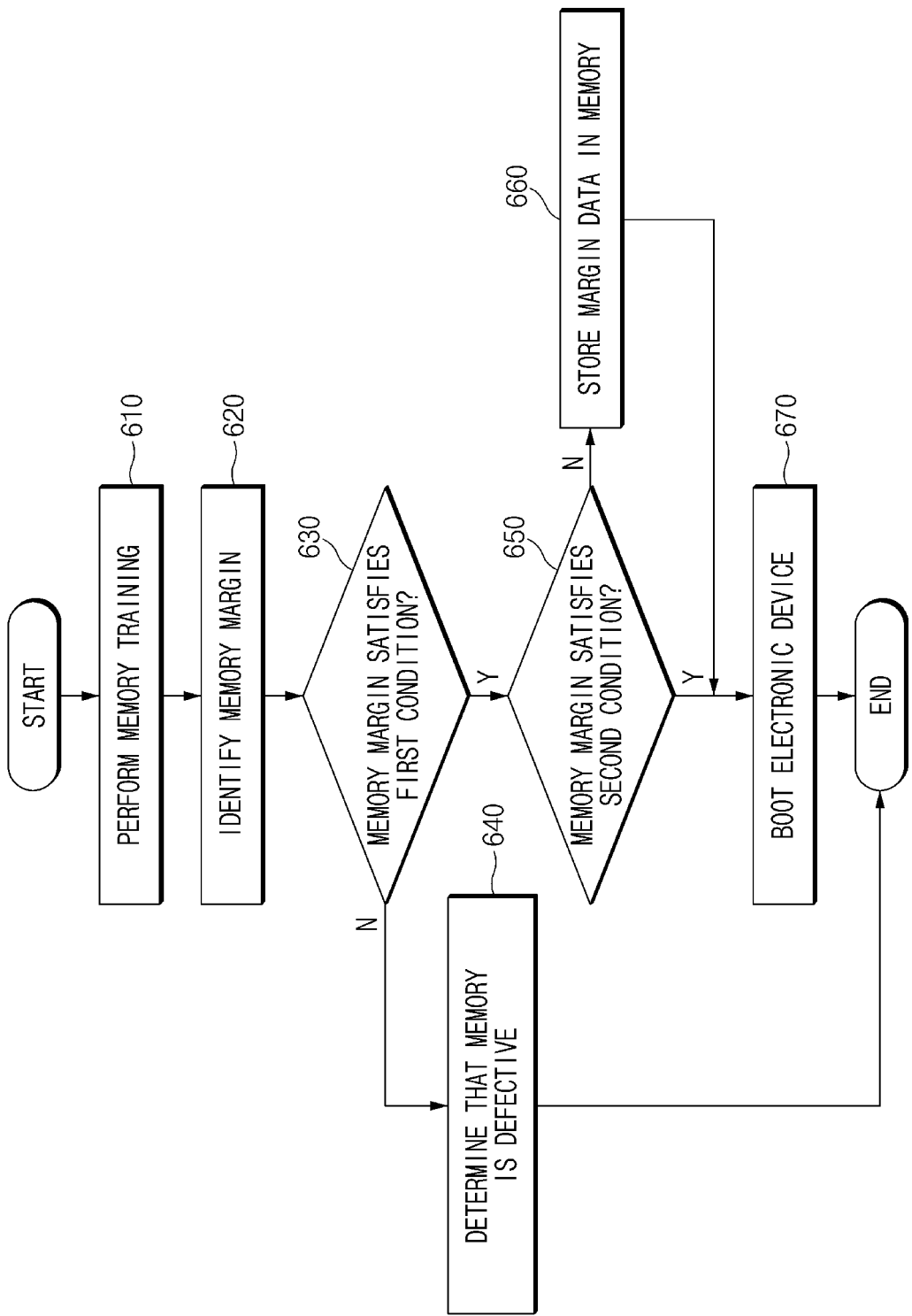
FIG. 6 is a flowchart illustrating a process of identifying a weak device, according to one or more embodiments.

FIG. 6 is a flowchart illustrating a process of identifying a weak device, according to one or more embodiments.

In operation 610, a processor (e.g., the processor 120 of FIG. 1) may perform memory training on a memory (e.g., the memory 130 of FIG. 1). The processor may improve the memory margin of a memory by performing memory training. The processor may improve the memory margin such that data transmission of data between the memory and the processor is made stably.

In operation 620, the processor may identify a memory margin of the memory. The memory margin may include information about a condition (e.g., a reference voltage of a memory and latency of the memory) under which data communication between the memory and the processor is made. The memory margin may correspond to an area specified by a user or an area preset on a system from among areas on a margin graph in which data communication between the memory and the processor is successful.

In operation 630, the processor may determine whether the memory margin of the memory satisfies a first condition. For example, when a margin area included in a margin graph corresponding to the memory margin includes a defect margin area, the processor may determine that the memory margin satisfies the first condition. For example, when all unit cells (e.g., unit cells in FIG. 3) in the defect margin area correspond to pass cells (e.g., pass cells in FIG. 3), the processor may determine that the memory margin satisfies the first condition. When the memory margin does not satisfy the first condition (operation 630-N), in operation 640, the processor may determine that the memory is defective.

When the memory margin satisfies the first condition (operation 630-Y), in operation 650, the processor may determine whether the memory margin satisfies a second condition. For example, when the margin area included in a margin graph corresponding to the memory margin includes a spare margin area, the processor may determine that the memory margin satisfies the second condition. For example, when all unit cells (e.g., unit cells in FIG. 3) in the spare margin area correspond to pass cells (e.g., pass cells in FIG. 3), the processor may determine that the memory margin satisfies the second condition.

When the memory margin does not satisfy the second condition (operation 650-N), in operation 660, the processor may store attribute data in a memory. The attribute data may include information about whether an electronic device corresponds to a weak device. The processor may store attribute data in the memory as a value of "true" or "false" depending on whether the electronic device is a weak device. After performing operation 660 or when the memory margin satisfies the second condition (operation 650-Y), in operation 670, the processor may boot the electronic device.

Figure 7:
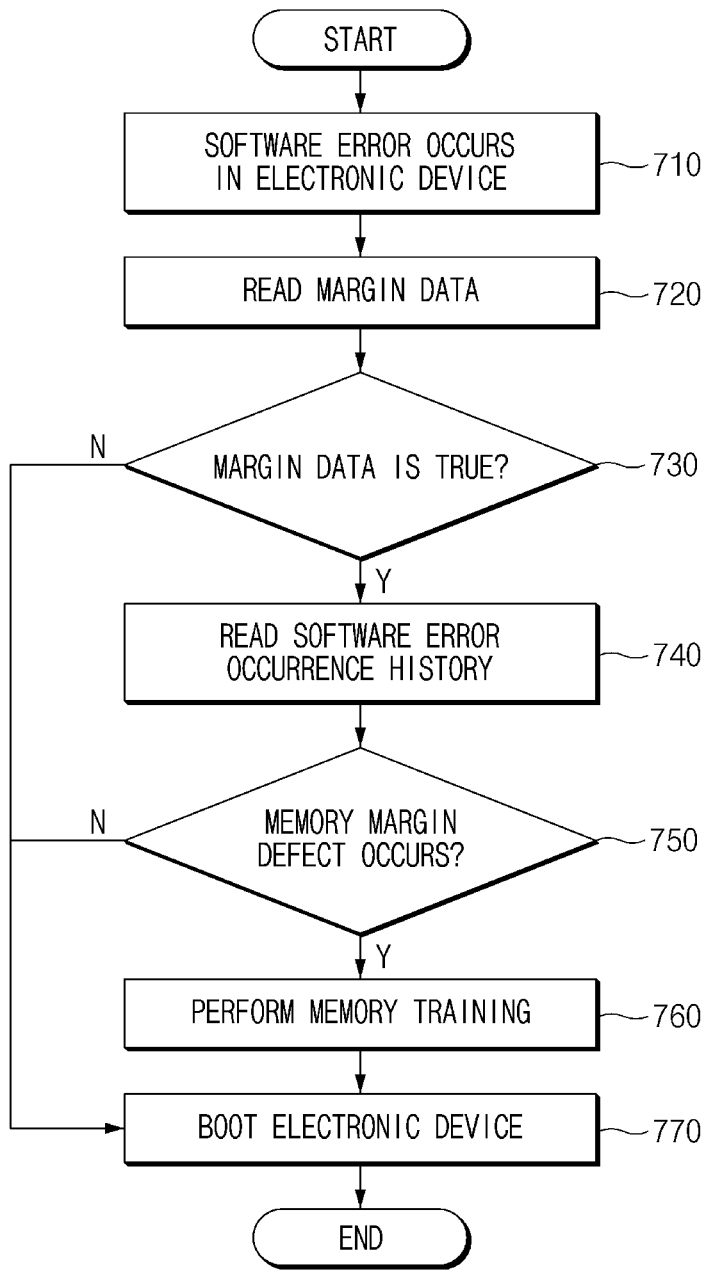
FIG. 7 is a flowchart illustrating a process of identifying a defect (memory margin defect) related to a memory margin configuration and performing memory training, according to one or more embodiments.

FIG. 7 is a flowchart illustrating a process of identifying a defect (memory margin defect) related to a memory margin configuration and performing memory training, according to one or more embodiments.

In operation 710, a processor may identify a software error occurring in an electronic device. The software error may include an error occurring in relation to a memory margin and/or an error occurring regardless of the memory margin. For example, the error occurring in relation to the memory margin may include list corruption, paging request fail, and/or zram decompression fail.

To determine whether the software error in operation 710 occurs in relation to a defect associated with a memory margin configuration, in operation 720, the processor may read attribute data stored in a memory. The attribute data may include information about whether an electronic device corresponds to a weak device. The processor may store attribute data in the memory as a value of "true" or "false" depending on whether the electronic device is a weak device. For convenience of description, hereinafter, when the electronic device is a weak device, it is assumed that the value of attribute data corresponds to "true."

In operation 730, the processor may determine whether a value of the read attribute data is "true." When the value of attribute data is "false" (operation 730-N), the process may proceed to operation 770, where the processor may boot the electronic device.

When the value of attribute data is "true" (operation 730-Y), in operation 740, the processor may read the software error occurrence history stored in the memory. The occurrence history of software errors may include information about software errors occurring in the electronic device. The information about the software error occurring in the electronic device may include register information, snapshots, and/or logs.

In operation 750, the processor may determine whether a defect related to a memory margin configuration occurs. The processor may identify a defect related to a memory margin configuration based on the occurrence history of software errors received from the memory and software errors occurring in the electronic device. The processor may determine whether the defect related to the memory margin configuration occurs in the memory, based on the number of times that a software error related to a memory margin occurs and an error state of the memory caused by a software error occurring in the electronic device. The method in which a processor determines whether a defect related to a memory margin configuration occurs may be performed by the processor in FIG. 2 and the margin defect identification module in FIG. 4.

The processor may identify a defect related to a memory margin configuration in an actual use environment of the electronic device different from a production environment of the memory. Accordingly, even after the production stage of the memory, the processor may perform memory training on the memory, thereby improving the defect related to the memory margin configuration.

When a defect associated with a memory margin configuration occurs (operation 750-Y), in operation 760, the processor may perform memory training on the memory. The processor may improve the memory margin of a memory by performing memory training. The processor may improve the memory margin such that data transmission of data between the memory and the processor is made stably. When a defect associated with a memory margin configuration does not occur (operation 750-N), in operation 770, the processor may boot the electronic device.

Figure 8:
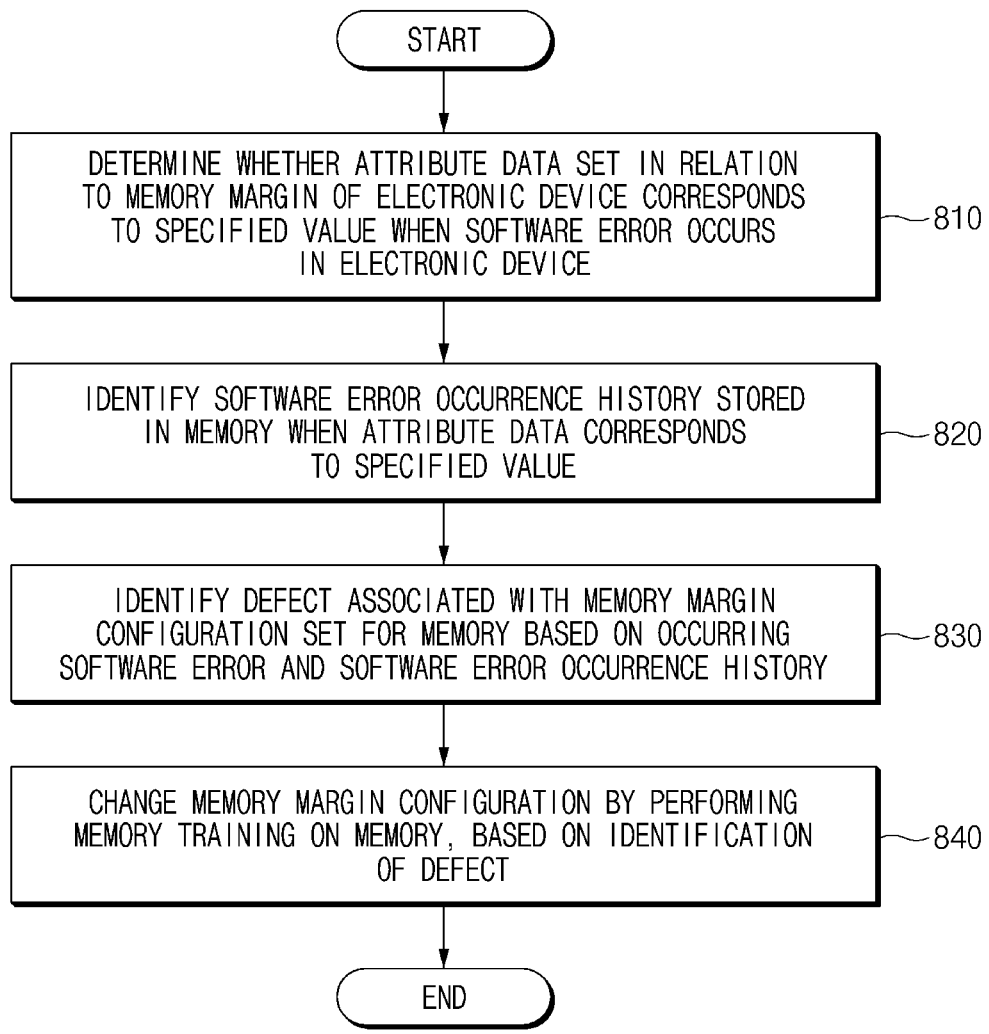
FIG. 8 is a flowchart illustrating a method of controlling an electronic device, according to one or more embodiments.

FIG. 8 is a flowchart illustrating a method of controlling an electronic device, according to one or more embodiments.

In operation 810, when a software error occurs in an electronic device, a processor may determine whether attribute data set in relation to a memory margin of the electronic device corresponds to a specified value. In operation 820, when the attribute data corresponds to the specified value, the processor may identify a software error occurrence history stored in a memory. In operation 830, the processor may identify a defect associated with a memory margin configuration set for the memory based on the occurring software error and the software error occurrence history. In operation 840, the processor may change the memory margin configuration by performing memory training on the memory based on the identification of the defect.

Figure 9:
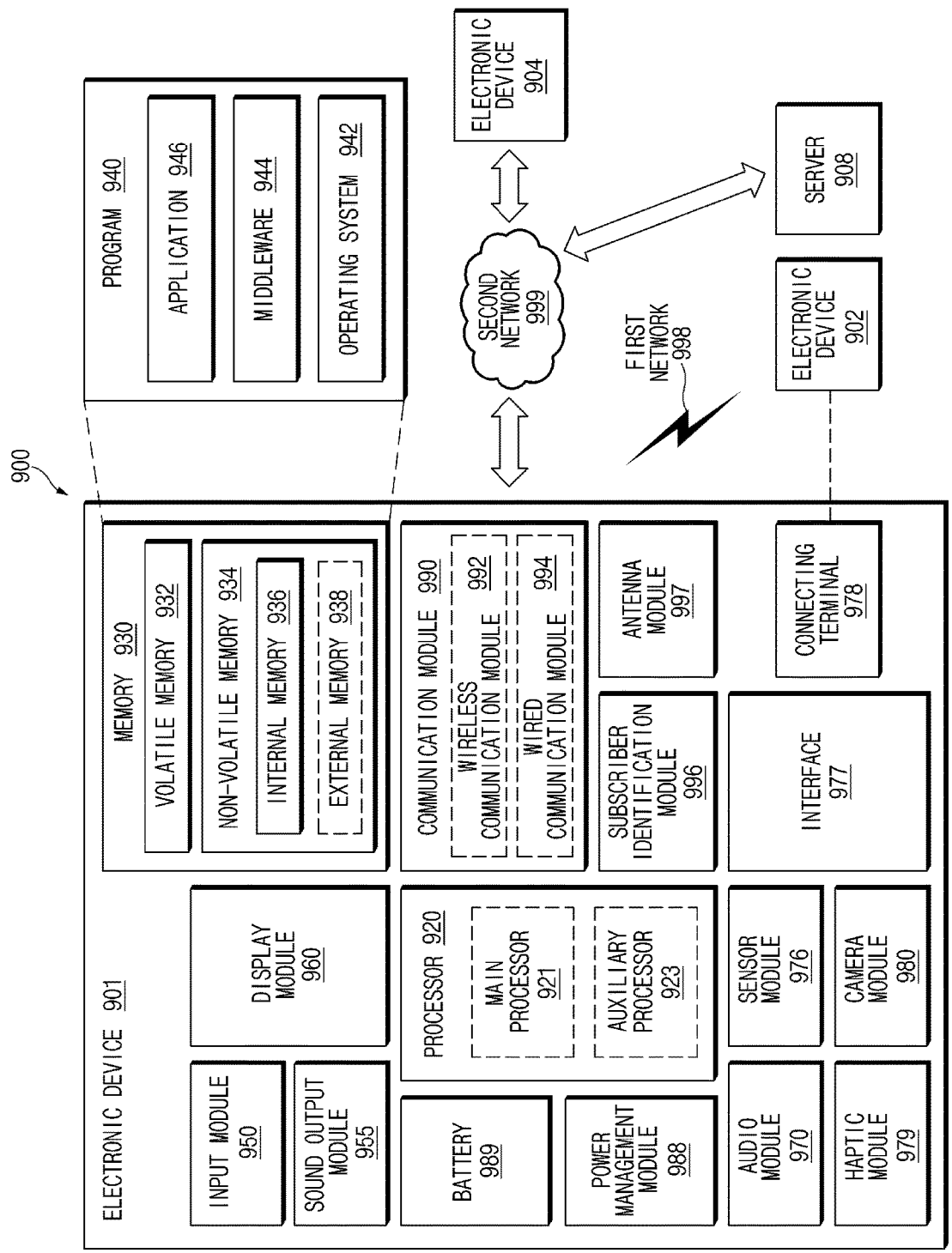
FIG. 9 is a block diagram of an electronic device in a network environment according to various embodiments; and With regard to description of drawings, the same or similar components will be marked by the same or similar reference signs.

FIG. 9 is a block diagram illustrating an electronic device 901 in a network environment 900 according to various embodiments. Referring to FIG. 9, the electronic device 901 in the network environment 900 may communicate with an electronic device 902 via a first network 998 (e.g., a short-range wireless communication network), or at least one of an electronic device 904 or a server 908 via a second network 999 (e.g., a long-range wireless communication network). According to one or more embodiments, the electronic device 901 may communicate with the electronic device 904 via the server 908. According to one or more embodiments, the electronic device 901 may include a processor 920, memory 930, an input module 950, a sound output module 955, a display module 960, an audio module 970, a sensor module 976, an interface 977, a connecting terminal 978, a haptic module 979, a camera module 980, a power management module 988, a battery 989, a communication module 990, a subscriber identification module (SIM) 996, or an antenna module 997. In some embodiments, at least one of the components (e.g., the connecting terminal 978) may be omitted from the electronic device 901, or one or more other components may be added in the electronic device 901. In some embodiments, some of the components (e.g., the sensor module 976, the camera module 980, or the antenna module 997) may be implemented as a single component (e.g., the display module 960).

The processor 920 may execute, for example, software (e.g., a program 940) to control at least one other component (e.g., a hardware or software component) of the electronic device 901 coupled with the processor 920, and may perform various data processing or computation. According to one embodiment, as at least part of the data processing or computation, the processor 920 may store a command or data received from another component (e.g., the sensor module 976 or the communication module 990) in volatile memory 932, process the command or the data stored in the volatile memory 932, and store resulting data in non-volatile memory 934. According to one or more embodiments, the processor 920 may include a main processor 921 (e.g., a central processing unit (CPU) or an application processor (AP)), or an auxiliary processor 923 (e.g., a graphics processing unit (GPU), a neural processing unit (NPU), an image signal processor (ISP), a sensor hub processor, or a communication processor (CP)) that is operable independently from, or in conjunction with, the main processor 921. For example, when the electronic device 901 includes the main processor 921 and the auxiliary processor 923, the auxiliary processor 923 may be adapted to consume less power than the main processor 921, or to be specific to a specified function. The auxiliary processor 923 may be implemented as separate from, or as part of the main processor 921.

The auxiliary processor 923 may control at least some of functions or states related to at least one component (e.g., the display module 960, the sensor module 976, or the communication module 990) among the components of the electronic device 901, instead of the main processor 921 while the main processor 921 is in an inactive (e.g., sleep) state, or together with the main processor 921 while the main processor 921 is in an active state (e.g., executing an application). According to one or more embodiments, the auxiliary processor 923 (e.g., an image signal processor or a communication processor) may be implemented as part of another component (e.g., the camera module 980 or the communication module 990) functionally related to the auxiliary processor 923. According to one or more embodiments, the auxiliary processor 923 (e.g., the neural processing unit) may include a hardware structure specified for artificial intelligence model processing. An artificial intelligence model may be generated by machine learning. Such learning may be performed, e.g., by the electronic device 901 where the artificial intelligence is performed or via a separate server (e.g., the server 908). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 930 may store various data used by at least one component (e.g., the processor 920 or the sensor module 976) of the electronic device 901. The various data may include, for example, software (e.g., the program 940) and input data or output data for a command related thereto. The memory 930 may include the volatile memory 932 or the non-volatile memory 934.

The program 940 may be stored in the memory 930 as software, and may include, for example, an operating system (OS) 942, middleware 944, or an application 946.

The input module 950 may receive a command or data to be used by another component (e.g., the processor 920) of the electronic device 901, from the outside (e.g., a user) of the electronic device 901. The input module 950 may include, for example, a microphone, a mouse, a keyboard, a key (e.g., a button), or a digital pen (e.g., a stylus pen).

The sound output module 955 may output sound signals to the outside of the electronic device 901. The sound output module 955 may include, for example, a speaker or a receiver. The speaker may be used for general purposes, such as playing multimedia or playing record. The receiver may be used for receiving incoming calls. According to one or more embodiments, the receiver may be implemented as separate from, or as part of the speaker.

The display module 960 may visually provide information to the outside (e.g., a user) of the electronic device 901. The display module 960 may include, for example, a display, a hologram device, or a projector and control circuitry to control a corresponding one of the display, hologram device, and projector. According to one or more embodiments, the display module 960 may include a touch sensor adapted to detect a touch, or a pressure sensor adapted to measure the intensity of force incurred by the touch.

The audio module 970 may convert a sound into an electrical signal and vice versa. According to one or more embodiments, the audio module 970 may obtain the sound via the input module 950, or output the sound via the sound output module 955 or a headphone of an external electronic device (e.g., an electronic device 902) directly (e.g., wiredly) or wirelessly coupled with the electronic device 901.

The sensor module 976 may detect an operational state (e.g., power or temperature) of the electronic device 901 or an environmental state (e.g., a state of a user) external to the electronic device 901, and then generate an electrical signal or data value corresponding to the detected state. According to one or more embodiments, the sensor module 976 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 977 may support one or more specified protocols to be used for the electronic device 901 to be coupled with the external electronic device (e.g., the electronic device 902) directly (e.g., wiredly) or wirelessly. According to one or more embodiments, the interface 977 may include, for example, a high definition multimedia interface (HDMI), a universal serial bus (USB) interface, a secure digital (SD) card interface, or an audio interface.

A connecting terminal 978 may include a connector via which the electronic device 901 may be physically connected with the external electronic device (e.g., the electronic device 902). According to one or more embodiments, the connecting terminal 978 may include, for example, a HDMI connector, a USB connector, a SD card connector, or an audio connector (e.g., a headphone connector).

The haptic module 979 may convert an electrical signal into a mechanical stimulus (e.g., a vibration or a movement) or electrical stimulus which may be recognized by a user via his tactile sensation or kinesthetic sensation. According to one or more embodiments, the haptic module 979 may include, for example, a motor, a piezoelectric element, or an electric stimulator.

The camera module 980 may capture a still image or moving images. According to one or more embodiments, the camera module 980 may include one or more lenses, image sensors, image signal processors, or flashes.

The power management module 988 may manage power supplied to the electronic device 901. According to one embodiment, the power management module 988 may be implemented as at least part of, for example, a power management integrated circuit (PMIC).

The battery 989 may supply power to at least one component of the electronic device 901. According to one or more embodiments, the battery 989 may include, for example, a primary cell which is not rechargeable, a secondary cell which is rechargeable, or a fuel cell.

The communication module 990 may support establishing a direct (e.g., wired) communication channel or a wireless communication channel between the electronic device 901 and the external electronic device (e.g., the electronic device 902, the electronic device 904, or the server 908) and performing communication via the established communication channel. The communication module 990 may include one or more communication processors that are operable independently from the processor 920 (e.g., the application processor (AP)) and supports a direct (e.g., wired) communication or a wireless communication. According to one or more embodiments, the communication module 990 may include a wireless communication module 992 (e.g., a cellular communication module, a short-range wireless communication module, or a global navigation satellite system (GNSS) communication module) or a wired communication module 994 (e.g., a local area network (LAN) communication module or a power line communication (PLC) module). A corresponding one of these communication modules may communicate with the external electronic device via the first network 998 (e.g., a short-range communication network, such as Bluetooth™, wireless-fidelity (Wi-Fi) direct, or infrared data association (IrDA)) or the second network 999 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 992 may identify and authenticate the electronic device 901 in a communication network, such as the first network 998 or the second network 999, using subscriber information (e.g., international mobile subscriber identity (IMSI)) stored in the subscriber identification module 996.

The wireless communication module 992 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 992 may support a high-frequency band (e.g., the mmWave band) to achieve, e.g., a high data transmission rate. The wireless communication module 992 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 992 may support various requirements specified in the electronic device 901, an external electronic device (e.g., the electronic device 904), or a network system (e.g., the second network 999). According to one or more embodiments, the wireless communication module 992 may support a peak data rate (e.g., 20 Gbps or more) for implementing eMBB, loss coverage (e.g., 964 dB or less) for implementing mMTC, or U-plane latency (e.g., 0.5 ms or less for each of downlink (DL) and uplink (UL), or a round trip of 9 ms or less) for implementing URLLC.

The antenna module 997 may transmit or receive a signal or power to or from the outside (e.g., the external electronic device) of the electronic device 901. According to one or more embodiments, the antenna module 997 may include an antenna including a radiating element composed of a conductive material or a conductive pattern formed in or on a substrate (e.g., a printed circuit board (PCB)). According to one or more embodiments, the antenna module 997 may include a plurality of antennas (e.g., array antennas). In such a case, at least one antenna appropriate for a communication scheme used in the communication network, such as the first network 998 or the second network 999, may be selected, for example, by the communication module 990 (e.g., the wireless communication module 992) from the plurality of antennas. The signal or the power may then be transmitted or received between the communication module 990 and the external electronic device via the selected at least one antenna. According to one or more embodiments, another component (e.g., a radio frequency integrated circuit (RFIC)) other than the radiating element may be additionally formed as part of the antenna module 997.

According to various embodiments, the antenna module 997 may form a mmWave antenna module. According to one or more embodiments, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to one or more embodiments, commands or data may be transmitted or received between the electronic device 901 and the external electronic device 904 via the server 908 coupled with the second network 999. Each of the electronic devices 902 or 904 may be a device of a same type as, or a different type, from the electronic device 901. According to one or more embodiments, all or some of operations to be executed at the electronic device 901 may be executed at one or more of the external electronic devices 902, 904, or 908. For example, if the electronic device 901 should perform a function or a service automatically, or in response to a request from a user or another device, the electronic device 901, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 901. The electronic device 901 may provide the outcome, with or without further processing of the outcome, as at least part of a reply to the request. To that end, a cloud computing, distributed computing, mobile edge computing (MEC), or client-server computing technology may be used, for example. The electronic device 901 may provide ultra low-latency services using, e.g., distributed computing or mobile edge computing. In another embodiment, the external electronic device 904 may include an internet-of-things (IoT) device. The server 908 may be an intelligent server using machine learning and/or a neural network. According to one or more embodiments, the external electronic device 904 or the server 908 may be included in the second network 999. The electronic device 901 may be applied to intelligent services (e.g., smart home, smart city, smart car, or healthcare) based on 5G communication technology or IoT-related technology.

An electronic device (e.g., the electronic device 101 of FIG. 1) may include a memory (e.g., the memory 130 of FIG. 1) and a processor (e.g., the processor 120 of FIG. 1) connected to the memory 130. The memory 130 may store instructions, which when executed by the processor 120, cause the electronic device 101 to determine whether attribute data set in relation to a memory margin of the electronic device 101 corresponds to a specified value when a software error occurs in the electronic device 101, to identify a software error occurrence history stored in the memory 130 when the attribute data corresponds to the specified value, to identify a defect associated with a memory margin configuration set for the memory 130 based on the occurring software error and the software error occurrence history, and to change the memory margin configuration by performing memory training on the memory 130 based on the identification of the defect. The memory margin may include information about a driving voltage and information about latency associated with data transmission.

The instructions may cause the electronic device 101 to identify the number of times that a software error occurs, based on the occurring software error and the software error occurrence history and to determine that the defect associated with the memory margin configuration occurs in the memory 130 when the number of times that a software error occurs is greater than or equal to a threshold count.

The occurring software error may correspond to a first software error. The software error occurrence history may include a history in which a second software error occurs.

The instructions may cause the electronic device 101 to determine that a defect associated with the memory margin occurs in the memory 130 when a first detected state, which occurs in the memory 130 due to the first software error and which is associated with the memory margin configuration, is the same as a second detected state, which occurs in the memory 130 due to the second software error and which is associated with the memory margin configuration, and a first log stored in the memory 130 depending on occurrence of the first software error is different from a second log stored in the memory 130 depending on occurrence of the second software error.

The instructions may cause the electronic device 101 to determine that a defect associated with the memory margin occurs in the memory 130 when a first detected state, which occurs in the memory 130 due to the first software error and which is associated with the memory margin configuration, is different from a second detected state, which occurs in the memory 130 due to the second software error and which is associated with the memory margin configuration.

The instructions may cause the electronic device 101 to eliminate the defect, which is associated with the memory margin configuration and which occurs in the memory 130, by changing the memory margin configuration.

The memory margin configuration may include at least one configuration of a configuration of the driving voltage and a configuration of the latency.

The instructions may cause the electronic device 101 to determine whether the data transmission performed based on the driving voltage and the latency, which are measured at a production stage of the memory 130, satisfies a specified condition and to store the attribute data so as to correspond to the specified value based on the determination.

The instructions may cause the electronic device 101 to determine that the data transmission satisfies the specified condition when at least one of the data transmissions performed at an arbitrary driving voltage included in a specified first range and arbitrary latency included in a specified second range fails.

The instructions may cause the electronic device 101 to store a software error occurrence history in the memory 130 when the software error occurs.

A method for controlling an electronic device 101 may include determining whether attribute data set in relation to a memory margin of the electronic device 101 corresponds to a specified value when a software error occurs in the electronic device 101, identifying a software error occurrence history stored in a memory 130 when the attribute data corresponds to the specified value, identifying a defect associated with a memory margin configuration set for the memory 130 based on the occurring software error and the software error occurrence history, and changing the memory margin configuration by performing memory training on the memory 130 based on the identification of the defect. The memory margin may include information about a driving voltage and information about latency associated with data transmission.

The identifying of the defect may include identifying the number of times that a software error occurs, based on the occurring software error and the software error occurrence history and when the number of times that a software error occurs is greater than or equal to a threshold count, determining that the defect associated with the memory margin configuration occurs in the memory 130.

The occurring software error may correspond to a first software error, and the software error occurrence history may include a history in which a second software error occurs.

The identifying of the defect may include determining that a defect associated with the memory margin occurs in the memory 130 when a first detected state, which occurs in the memory 130 due to the first software error and which is associated with the memory margin configuration, is the same as a second detected state, which occurs in the memory 130 due to the second software error and which is associated with the memory margin configuration, and a first log stored in the memory 130 depending on occurrence of the first software error is different from a second log stored in the memory 130 depending on occurrence of the second software error.

The identifying of the defect may include determining that a defect associated with the memory margin occurs in the memory 130 when a first detected state, which occurs in the memory 130 due to the first software error and which is associated with the memory margin configuration, is different from a second detected state, which occurs in the memory 130 due to the second software error and which is associated with the memory margin configuration.

The changing of the memory margin configuration may include eliminating the defect, which is associated with the memory margin configuration and which occurs in the memory 130.

The memory margin configuration may include at least one configuration of a configuration of the driving voltage and a configuration of the latency.

The method for controlling the electronic device 101 may further include determining whether the data transmission performed based on the driving voltage and the latency, which are measured at a production stage of the memory, satisfies a specified condition and storing the attribute data so as to correspond to the specified value based on the determination.

The determining of whether the data transmission satisfies the specified condition may include determining that the data transmission satisfies the specified condition when at least one of the data transmissions performed at an arbitrary driving voltage included in a specified first range and arbitrary latency included in a specified second range fails.

The method for controlling the electronic device 101 may further include storing a software error occurrence history in the memory 130 when the software error occurs.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to one or more embodiments of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B,"

"at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to one or more embodiments, the module may be implemented in a form of an application-specific integrated circuit (ASIC).

Various embodiments as set forth herein may be implemented as software (e.g., the program 940) including one or more instructions that are stored in a storage medium (e.g., internal memory 936 or external memory 938) that is readable by a machine (e.g., the electronic device 901). For example, a processor (e.g., the processor 920) of the machine (e.g., the electronic device 901) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to one or more embodiments, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
a memory storing instructions; and
a processor connected to the memory and configured to execute the instructions to:
based on a software error occurring in the electronic device, determine whether attribute data set in relation to a memory margin of the electronic device corresponds to a specified value,
based on determining that the attribute data corresponds to the specified value, identify a software error occurrence history stored in the memory,
identify a defect associated with a memory margin configuration set for the memory based on the occurring software error and the software error occurrence history, and
change the memory margin configuration by performing memory training on the memory based on the identification of the defect,
wherein the memory margin comprises information about a driving voltage and information about latency associated with data transmission.

2. The electronic device of claim 1, wherein the processor is further configured to execute the instructions to:
identify a number of times that the software error occurs, based on the occurring software error and the software error occurrence history; and
based on identifying that the number of times that the software error occurs is greater than or equal to a threshold count, determine that the defect associated with the memory margin configuration occurs in the memory.

3. The electronic device of claim 1, wherein the occurring software error corresponds to a first software error, and
wherein the software error occurrence history comprises a history in which a second software error occurs.

4. The electronic device of claim 3, wherein the processor is further configured to execute the instructions to:
determine that a defect associated with the memory margin occurs in the memory based on (i) a first detected state, which occurs in the memory due to the first software error and which is associated with the memory margin configuration, being the same as a second detected state, which occurs in the memory due to the second software error and which is associated with the memory margin configuration, and (ii) a first log stored in the memory depending on occurrence of the first software error being different from a second log stored in the memory depending on occurrence of the second software error.

5. The electronic device of claim 3, wherein the processor is further configured to execute the instructions to:

determine that a defect associated with the memory margin occurs in the memory based on a first detected state, which occurs in the memory due to the first software error and which is associated with the memory margin configuration, being different from a second detected state, which occurs in the memory due to the second software error and which is associated with the memory margin configuration.

6. The electronic device of claim 1, wherein the processor is further configured to execute the instructions to:
correct the defect, which is associated with the memory margin configuration and which occurs in the memory, by changing the memory margin configuration.

7. The electronic device of claim 6, wherein the memory margin configuration comprises at least one configuration of a configuration of the driving voltage and a configuration of the latency.

8. The electronic device of claim 1, wherein the processor is further configured to execute the instructions to:
determine whether the data transmission performed based on the driving voltage and the latency, which are measured at a production stage of the memory, satisfies a specified condition; and
store the attribute data to correspond to the specified value based on a result of determining whether the data transmission satisfies the specified condition.

9. The electronic device of claim 8, wherein the processor is further configured to execute the instructions to:
based on at least one of the data transmission performed at an arbitrary driving voltage included in a specified first range and arbitrary latency included in a specified second range failing, determine that the data transmission satisfies the specified condition.

10. The electronic device of claim 1, wherein the processor is further configured to execute the instructions to:
based on the software error occurring, store the software error occurrence history in the memory.

11. A method for controlling an electronic device, the method comprising:
based on a software error occurring in the electronic device, determining whether attribute data set in relation to a memory margin of the electronic device corresponds to a specified value;
based on determining that the attribute data corresponds to the specified value, identifying a software error occurrence history stored in a memory;
identifying a defect associated with a memory margin configuration set for the memory based on the occurring software error and the software error occurrence history; and
changing the memory margin configuration by performing memory training on the memory based on the identifying of the defect,
wherein the memory margin comprises information about a driving voltage and information about latency associated with data transmission.

12. The method of claim 11, wherein the identifying of the defect comprises:
identifying a number of times that a software error occurs, based on the occurring software error and the software error occurrence history; and
based on identifying that the number of times that the software error occurs is greater than or equal to a threshold count, determining that the defect associated with the memory margin configuration occurs in the memory.

13. The method of claim 11, wherein the occurring software error corresponds to a first software error, and
wherein the software error occurrence history comprises a history in which a second software error occurs.

14. The method of claim 13, wherein the identifying of the defect comprises:
determining that a defect associated with the memory margin occurs in the memory based on (i) a first detected state, which occurs in the memory due to the first software error and which is associated with the memory margin configuration, being the same as a second detected state, which occurs in the memory due to the second software error and which is associated with the memory margin configuration, and (ii) a first log stored in the memory depending on occurrence of the first software error being different from a second log stored in the memory depending on occurrence of the second software error.

15. The method of claim 13, wherein the identifying of the defect comprises:
determining that a defect associated with the memory margin occurs in the memory based on a first detected state, which occurs in the memory due to the first software error and which is associated with the memory margin configuration, being different from a second detected state, which occurs in the memory due to the second software error and which is associated with the memory margin configuration.

16. The method of claim 11, wherein the changing of the memory margin configuration comprises:
correcting the defect, which is associated with the memory margin configuration and which occurs in the memory.

17. The method of claim 11, wherein the memory margin configuration comprises at least one configuration of a configuration of the driving voltage and a configuration of the latency.

18. The method of claim 11, further comprising:
determining whether the data transmission performed based on the driving voltage and the latency, which are measured at a production stage of the memory, satisfies a specified condition; and
storing the attribute data to correspond to the specified value based on a result of the determining whether the data transmission satisfies the specified condition.

19. The method of claim 18, wherein the determining of whether the data transmission satisfies the specified condition comprises:
based on at least one of the data transmission performed at an arbitrary driving voltage included in a specified first range and arbitrary latency included in a specified second range failing, determining that the data transmission satisfies the specified condition.

20. The method of claim 11, further comprising:
based on the software error occurring, storing the software error occurrence history in the memory.

* * * * *